(12) United States Patent
Kawada

(10) Patent No.: US 10,818,771 B2
(45) Date of Patent: Oct. 27, 2020

(54) METHOD OF MANUFACTURING SILICON CARBIDE SEMICONDUCTOR DEVICE, AND METHOD OF MANUFACTURING SILICON CARBIDE SUBSTRATE

(71) Applicant: Fuji Electric Co., Ltd., Kanagawa (JP)

(72) Inventor: Yasuyuki Kawada, Ibaraki (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 16/241,153

(22) Filed: Jan. 7, 2019

(65) Prior Publication Data
US 2019/0252517 A1 Aug. 15, 2019

(30) Foreign Application Priority Data
Feb. 9, 2018 (JP) .................. 2018-022565

(51) Int. Cl.
| | | |
|---|---|---|
| H01L 21/02 | (2006.01) | |
| H01L 29/66 | (2006.01) | |
| H01L 29/06 | (2006.01) | |
| H01L 29/16 | (2006.01) | |
| H01L 21/033 | (2006.01) | |
| H01L 21/308 | (2006.01) | |
| H01L 29/78 | (2006.01) | |
| H01L 21/04 | (2006.01) | |

(52) U.S. Cl.
CPC .. H01L 29/66068 (2013.01); H01L 21/02378 (2013.01); H01L 21/0337 (2013.01); H01L 21/3086 (2013.01); H01L 29/0634 (2013.01); H01L 29/1608 (2013.01); H01L 29/7802 (2013.01); *H01L 21/0475* (2013.01)

(58) Field of Classification Search
CPC ............................................... H01L 21/02378
See application file for complete search history.

(56) References Cited

U.S. PATENT DOCUMENTS

| | | | | |
|---|---|---|---|---|
| 2004/0082150 A1* | 4/2004 | Kong | ................ | H01L 21/02491 |
| | | | | 438/481 |
| 2007/0072398 A1* | 3/2007 | Shibata | ................ | H01L 29/045 |
| | | | | 438/478 |
| 2015/0111368 A1* | 4/2015 | Tsuji | ...................... | C30B 25/20 |
| | | | | 438/478 |

FOREIGN PATENT DOCUMENTS

| | | |
|---|---|---|
| JP | 2007-096137 A | 4/2007 |
| JP | 2012-064958 A | 3/2012 |

OTHER PUBLICATIONS

Li, et al., Journal of Elec Materi (2005) 34: 450. https://doi.org/10.1007/s11664-005-0126-1. (Year: 2005).*

* cited by examiner

*Primary Examiner* — Peniel M Gumedzoe
*Assistant Examiner* — Christopher A Johnson
(74) *Attorney, Agent, or Firm* — Chen Yoshimura LLP

(57) ABSTRACT

A plurality of trenches are formed so as to reach a prescribed depth from the surface of an n-type epitaxial layer. A refractory metal carbide film, such as a TaC film is formed via sputtering on the surface of sections (mesa regions) of the n-type epitaxial layer interposed between the adjacent trenches. Sections of the TaC film on the inner walls of the trenches are removed via etching. While the surface of the mesa regions is covered by the TaC film, the inside of the trenches is filled with a p-type epitaxial layer that is grown by CVD, thereby forming a parallel pn structure. Then, sections of the p-type epitaxial layer protruding above the surface of the parallel pn structure and the TaC film above the surface of the mesa regions are ground until top surfaces of n-type regions and p-type regions of the parallel pn structure are exposed.

10 Claims, 6 Drawing Sheets

METHOD OF MANUFACTURING SILICON CARBIDE SEMICONDUCTOR DEVICE, AND METHOD OF MANUFACTURING SILICON CARBIDE SUBSTRATE

BACKGROUND OF THE INVENTION

Technical Field

The present invention relates to a method of manufacturing a silicon carbide semiconductor device, and a method of manufacturing a silicon carbide substrate.

Background Art

Super junction (SJ) semiconductor devices are known where the drift layer is conventionally configured to be a parallel pn structure in which n-type regions and p-type regions with heightened impurity concentrations are alternately and repeatedly disposed in a direction parallel to the substrate main surface (hereinafter, in the horizontal direction). It is known that method of manufacturing a super junction semiconductor device includes forming the parallel pn structure by a trench-filling epitaxial scheme.

In the trench-filling epitaxial scheme, an n-type epitaxial layer is formed on an n$^+$ starting substrate, and trenches are formed in the n-type epitaxial layer. A p-type epitaxial layer is then formed on the n-type epitaxial layer, including the inside of the trenches, in order to fill the inside of the trenches with the p-type epitaxial layer, thus forming the parallel pn structure (e.g., refer to Patent Documents 1 and 2 below).

In Patent Documents 1 and 2 below, the generation of voids is prevented by supplying a halide gas while filling the inside of the trenches with the epitaxial layer, and epitaxial growth near the surface of the semiconductor substrate is prevented. Furthermore, in Patent Document 2 below, the growth rate of the epitaxial layer at the vicinity of the trench openings is made to be slower than the growth rate of the epitaxial layer at the bottom surface side of the trenches, thereby preventing the epitaxial layer from blocking the vicinity of the trench openings.

Currently, the development of silicon (Si) has almost reached material limits. Due to this, there is research into semiconductor materials to replace silicon, and silicon carbide (SiC) has attracted attention as a semiconductor material that has a low ON voltage and excellent high-speed characteristics and high temperature characteristics. A parallel pn structure can be formed by the trench-filling epitaxial scheme even when the semiconductor material is silicon carbide.

RELATED ART DOCUMENTS

Patent Documents

Patent Document 1: Japanese Patent Application Laid-Open Publication No. 2007-096137

Patent Document 2: Japanese Patent Application Laid-Open Publication No. 2012-064958

SUMMARY OF THE INVENTION

However, as the result of much diligent research by the inventor of the present invention, it has been found that the following problems occur in the realization of a super junction semiconductor device with a high withstand voltage and low ON resistance when using a trench-filling epitaxial scheme with a semiconductor material of silicon carbide to form a parallel pn structure 105 in which n-type regions 103 and p-type regions 104 are alternately and repeatedly disposed in the horizontal direction. FIG. 10 is a cross-sectional view of a conventional silicon carbide semiconductor device during manufacturing.

In order to realize a super junction semiconductor device with a high withstand voltage and low ON resistance, trenches 131 with a high aspect ratio (=depth d101 of the trenches 131/width w101 of the trenches 131) are formed in an n-type epitaxial layer 121, which serves as the n-type regions 103 of the parallel pn structure 105. Then, the inside of the trenches 131 must be filled with a p-type epitaxial layer 122, which serves as the p-type regions 104 of the parallel pn structure 105.

The filling of the inside the trenches 131 with the p-type epitaxial layer 122 is more difficult the higher that the aspect ratio of the trenches 131 is. Furthermore, on the surface of the sections (mesa regions) 121a of the n-type epitaxial layer 121 between adjacent trenches 131, portions 122a of the p-type epitaxial layer 122 are epitaxially grown in column shapes that protrude vertically on the surface of the mesa regions 121a. Sections 122b of the p-type epitaxial layer 122 above the n-type epitaxial layer 121, which include the column-shaped sections 122a, are unnecessary sections that are not used as any part of the silicon carbide semiconductor device.

When the portions 122a of the p-type epitaxial layer 122 are epitaxially grown in column shapes on the surface of the mesa regions 121a in this manner, the p-type epitaxial layer 122 is epitaxially grown inside the trenches 131 with material gases that flow into spaces 132 between the column-shaped sections 122a of the p-type epitaxial layer 122. When the p-type epitaxial layer 122 is grown to completely fill in the inside of the trenches 131, then a height h101 of the column-shaped sections 122a of the p-type epitaxial layer 122 would be equal to or more than the depth d101 of the trenches 131.

Furthermore, in a case where the portions 122a of the p-type epitaxial layer 122 have been epitaxially grown in column shapes on the surface of the mesa regions 121a, if the height h101 of the column-shaped sections 122a of the p-type epitaxial layer 122 increases, then sections would be generated where a gap (the width of the space 132 into which the material gases flow) w102 between the column-shaped sections 122a of the p-type epitaxial layer 122 is narrowed. Due to this, it would become harder for the material gases to flow to the inside of the trenches 131, and thus more difficult to fill the inside of the trenches 131 with the p-type epitaxial layer 122.

As a method to eliminate this problem, there is a method, such as is disclosed in Patent Documents 1 and 2 above, in which an etching gas such as hydrogen chloride (HCl) is introduced in large quantities together with material gases to a growth furnace of an epitaxial growth device in order to etch the sections 122a of the p-type epitaxial layer 122 that epitaxially grow on the surface of the mesa regions 121a, thereby preventing the epitaxial growth of these sections 122a while filling the inside of the trenches 131 with the p-type epitaxial layer 122.

However, in a method that uses the etching effects of HCl gas, the sections of the p-type epitaxial layer 122 filled inside of the trenches 131 will also be somewhat etched, and thus it is impossible to fill the inside of the trenches 131 with the p-type epitaxial layer 122 at a high speed. Moreover, there is the problem of the constituent components of the epitaxial growth device being easily degraded (corrosion of metal parts, etc.) by the large quantities of HCl gas introduced.

In order to eliminate the problems of the conventional technology described above, the present invention aims at providing a method of manufacturing a silicon carbide semiconductor device and a method of manufacturing a silicon carbide substrate that make it possible to shorten lead time and to prevent degradation of the semiconductor manufacturing device.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a method for manufacturing a silicon carbide semiconductor device having a parallel pn structure in which a first conductivity type region and a second conductivity type region are alternately disposed side-by-side in a horizontal direction, the method including: a first step of forming a vertical trench in a semiconductor substrate of the first conductivity type made of silicon carbide, the trench reaching a prescribed depth from a front surface of the semiconductor substrate; a second step of forming a mask film covering portions of the front surface of the semiconductor substrate where the trench is not formed, the mask film being absent within the trench; and a third step of epitaxially growing a second conductivity type silicon carbide layer while the front surface of the semiconductor substrate is covered by the mask film, so as to fill an inside of the trench with the epitaxially grown second conductivity type silicon carbide layer, thereby creating the parallel pn structure, wherein, in the second step, the mask film is formed of a carbide of a refractory metal that can withstand an epitaxial growth temperature during the third step of epitaxially growing the second conductivity type silicon carbide layer and that causes a growth rate of the second conductivity type silicon carbide layer on the mask film in the third step to be slower than a growth rate of the second conductivity type silicon carbide inside the trench in the third step.

In the method of manufacturing the silicon carbide semiconductor device according to the present invention, in the second step, the mask film may be formed at a thickness not less than 20 nm and not more than 40 nm.

In the method of manufacturing the silicon carbide semiconductor device according to the present invention, in the second step, the mask film may be formed via sputtering.

The method of manufacturing the silicon carbide semiconductor device according to the present invention may further include, after the third step, a fourth step of etching, from above, a portion of the epitaxially grown second conductivity type silicon carbide layer that is formed on the mask film and successively etching the mask film thereunder so as to expose the front surface of the semiconductor substrate of the first conductivity type, thereby creating an exposed flat top surface of the parallel pn structure.

The method of manufacturing the silicon carbide semiconductor device according to the present invention may further include, after the fourth step, a fifth step of making a device structure on or over the exposed flat top surface of the parallel pn structure.

In the method of manufacturing the silicon carbide semiconductor device according to the present invention, in the first step, the trench may be formed with an aspect ratio of 5 or greater, the aspect ratio being defined as a ratio of a depth of the trench to a width of the trench.

The method of manufacturing the silicon carbide semiconductor device according to the present invention may further include, prior to the first step, a step of making the semiconductor substrate by layering a first conductivity type epitaxial layer made of silicon carbide on a starting substrate made of silicon carbide, thereby forming the semiconductor substrate constituted of the starting substrate and the first conductivity type epitaxial layer thereon, and wherein, in the first step, the trench is formed in the first conductivity type epitaxial layer.

In the method of manufacturing the silicon carbide semiconductor device according to the present invention, in the second step, a tantalum carbide film may be formed as the mask film.

In the method of manufacturing the silicon carbide semiconductor device according to the present invention, in the first step, the trench may be formed in a plurality so that the parallel pn structure includes the first conductivity type region in a plurality and the second conductivity type region in a plurality that are alternately and repeatedly disposed side-by-side in the horizontal direction.

In the method of manufacturing the silicon carbide semiconductor device according to the present invention, the second step may include: forming a layer made of the carbide of the refractory metal over an entire surface of the semiconductor substrate having the trench formed therein; and exposing the layer made of the carbide of the refractory metal to an etchant so as to remove the layer made of the carbide of the refractory metal entirely from the trench and leaving the layer made of the carbide of the refractory metal on the portions of the front surface of the semiconductor substrate where the trench is not formed, thereby forming the mask layer.

The method of manufacturing the silicon carbide semiconductor device may further include, after the third step, a fourth step of grinding and polishing a top layer of the semiconductor substrate that includes the epitaxially grown second conductivity type silicon carbide on the mask film and the mask film thereunder so as to expose the front surface of the semiconductor substrate of the first conductivity type, thereby creating an exposed flat top surface of the parallel pn structure.

The method of manufacturing the silicon carbide semiconductor device may further include, after the fourth step, a fifth step of making a device structure on or over the exposed flat top surface of the parallel pn structure.

According to the invention described above, it is difficult for the second conductivity type epitaxial layer to epitaxially grow on the mask film formed by the aforementioned carbide of the refractory metal, and thus excess column-shaped second conductivity type epitaxial layers do not grow on the surface between trenches (the mesa regions). Due to this, it is possible to efficiently fill the inside of the trenches with the p-type epitaxial layer. Furthermore, the excess column-shaped second conductivity type epitaxial layers do not grow on the surface of the mesa regions, which makes it possible to reduce the amount of etching gas such as HCl that is introduced to the epitaxial growth furnace.

The method of manufacturing the silicon carbide semiconductor device and the method of manufacturing the silicon carbide substrate of the present invention make it possible to shorten lead time and to prevent degradation of ae semiconductor manufacturing device.

It is to be understood that both the foregoing general description and the following detailed description are exemplary and explanatory, and are intended to provide further explanation of the invention as claimed.

DETAILED DESCRIPTION OF EMBODIMENTS

Figure 1:
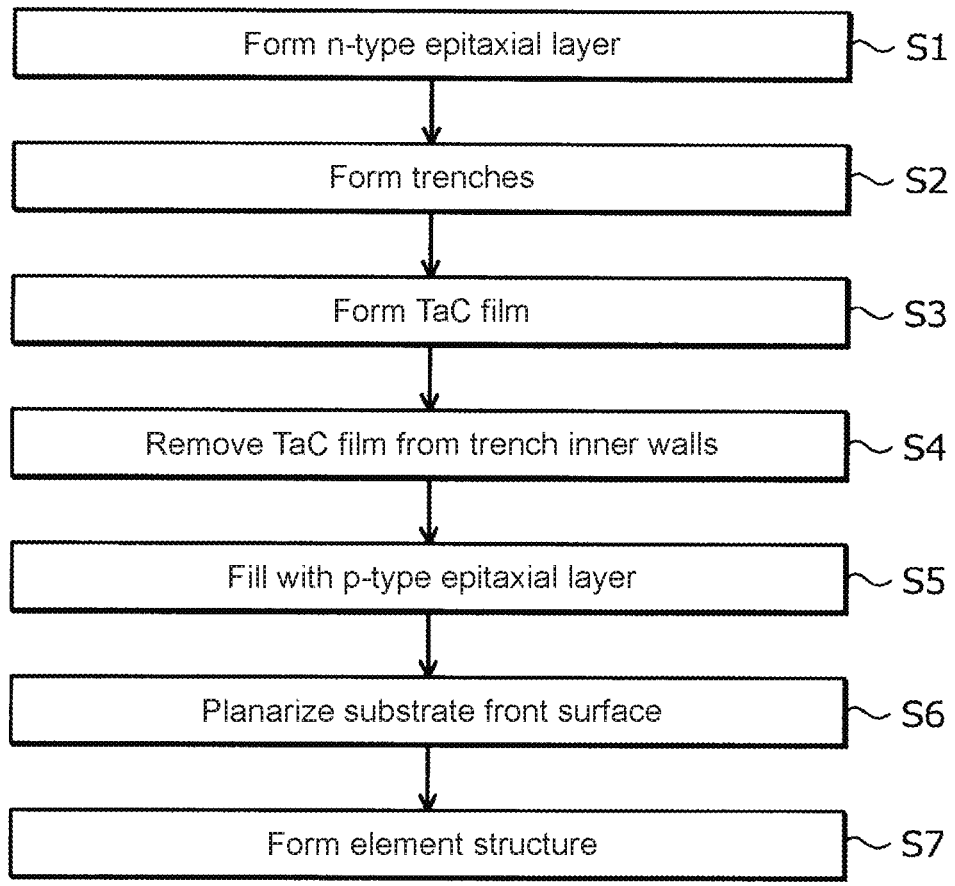
FIG. 1 is a flowchart of an overview of a method of manufacturing a silicon carbide semiconductor device according to an embodiment of the present invention.

Suitable embodiments of a method of manufacturing a silicon carbide semiconductor device and a method of manufacturing a silicon carbide substrate according to the present invention will be explained in detail below with reference to the attached drawings. In the present specification and attached drawings, an "n" or "p" marked in layers or regions respectively signifies that, electrons or holes are majority carriers. The "+" or "−" attached to the "n" or "p" respectively signify higher impurity concentrations or lower impurity concentrations than layers or regions without these marks. In the explanation of the embodiment below and the attached drawings, the same reference characters are attached to similar configurations and repetitive descriptions will be omitted. Furthermore, when representing Miller indices in the present specification, "−" signifies a bar attached to the index immediately thereafter, and attaching a "−" before the index represents a negative index.

(Embodiment)

A method of manufacturing a silicon carbide (SiC) semiconductor device according to an embodiment of the present invention will be described by using an example of fabricating (manufacturing) a super junction (SJ) semiconductor device in which a drift layer is configured to be a parallel pn structure 5 in which n-type regions 3 and p-type regions 4 with heightened impurity concentrations are alternately and repeatedly disposed in a direction parallel to the substrate front surface (in a horizontal direction; in the second direction Y described later). FIG. 1 is a flowchart of an overview of the method of manufacturing the silicon carbide semiconductor device according to the embodiment.

FIGS. 2 to 8 are cross-sectional views of the silicon carbide semiconductor device of the embodiment during manufacturing. FIGS. 2 to 8 show cross-sectional structures for a case where a super junction MOSFET (metal oxide semiconductor field effect transistor) is fabricated (manufactured). Furthermore, FIGS. 2 to 8 indicate the conductivity type of an $n^+$ starting substrate 1, which serves as an $n^+$ drain layer, with "$n^+$ sub."

Figure 2:
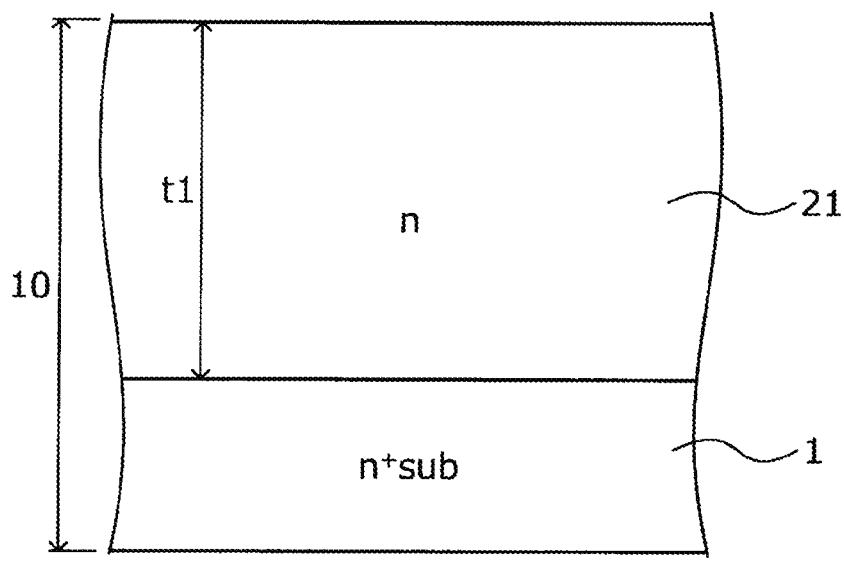
FIG. 2 is a cross-sectional view of the silicon carbide semiconductor device of the embodiment during manufacturing.

First, as shown in FIG. 2, the $n^+$ starting substrate 1, which is made of silicon carbide, is cleaned by organic cleaning and RCA cleaning or the like, for example. The $n^+$ starting substrate 1 may have a four-layer periodic hexagonal crystal structure (4H—SiC) and the front surface may be the (0001) plane, i.e., a so-called Si plane. Next, an n-type epitaxial layer 21 made of silicon carbide in which an n-type impurity such as nitrogen (N), for example, has been introduced at a prescribed doping concentration is epitaxially grown on the front surface of the $n^+$ starting substrate 1 (step S1).

The process in step S1 fabricates an epitaxial substrate (semiconductor wafer) 10 where the n-type epitaxial layer 21 has been deposited on the front surface of the $n^+$ starting substrate 1. A thickness t1 of the n-type epitaxial layer 21 is determined in accordance with the withstand voltage of the silicon carbide semiconductor device of the embodiment and is thicker the higher the withstand voltage is set. If the silicon carbide semiconductor device of the embodiment is a 3.3 kV class in regard to the withstand voltage, for example, then the thickness t1 of the n-type epitaxial layer 21 may be around 30 μm.

Furthermore, if the silicon carbide semiconductor device of the embodiment is a 6.5 kV class in regard to the withstand voltage, for example, then the thickness t1 of the n-type epitaxial layer 21 may be around 70 μm. In such case, the thickness (i.e., a depth d1 of a trench 33) of the parallel pn structure 5 (described later) may be set to not less than approximately 25 μm and not more than approximately 30 μm, for example, and a standard n drift layer (i.e., an $n^−$ drift layer without an SJ structure) may be provided between the parallel pn structure 5 and an n-type buffer layer 2 (described later) at a thickness of around 40 μm.

Figure 3:
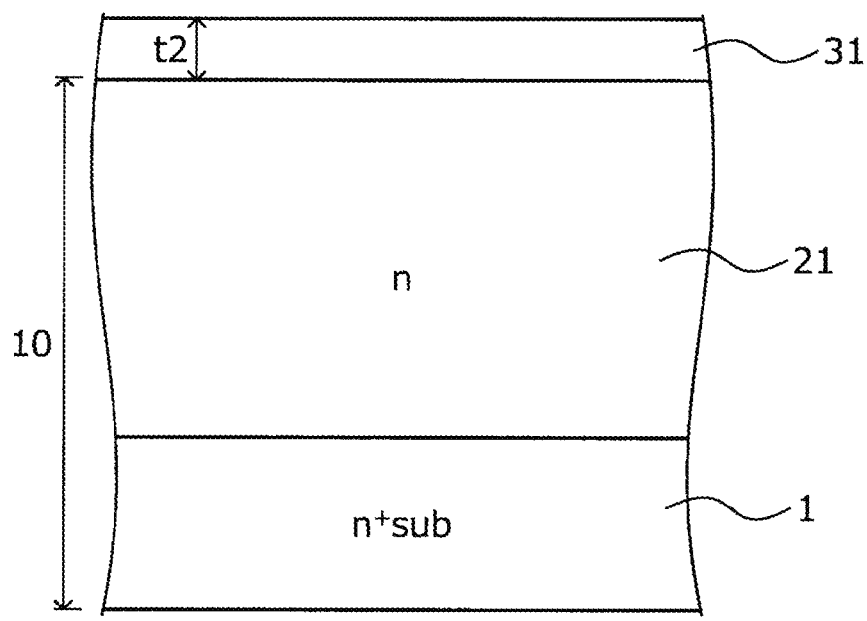
FIG. 3 is a cross-sectional view of the silicon carbide semiconductor device of the embodiment during manufacturing.

Next, after cleaning the epitaxial substrate 10, as shown in FIG. 3, plasma chemical vapor deposition (PCVD), for example, is used to form an oxide film ($SiO_2$ film) 31 on the front surface of the epitaxial substrate 10 (on the surface of the n-type epitaxial layer 21 of the epitaxial substrate 10).

A thickness t2 of the oxide film 31 is the thickness required for using the oxide film 31 as an etching mask during forming of the trenches 33, which are formed in a later step (see FIG. 5). The trenches 33 are filled with a p-type epitaxial layer 22 in a later step. Specifically, the thickness t2 of the oxide film 31 is a thickness at which the oxide film 31 will not be lost due to dry etching to form the trenches 33, and may be around 5 μm, for example.

Figure 4:
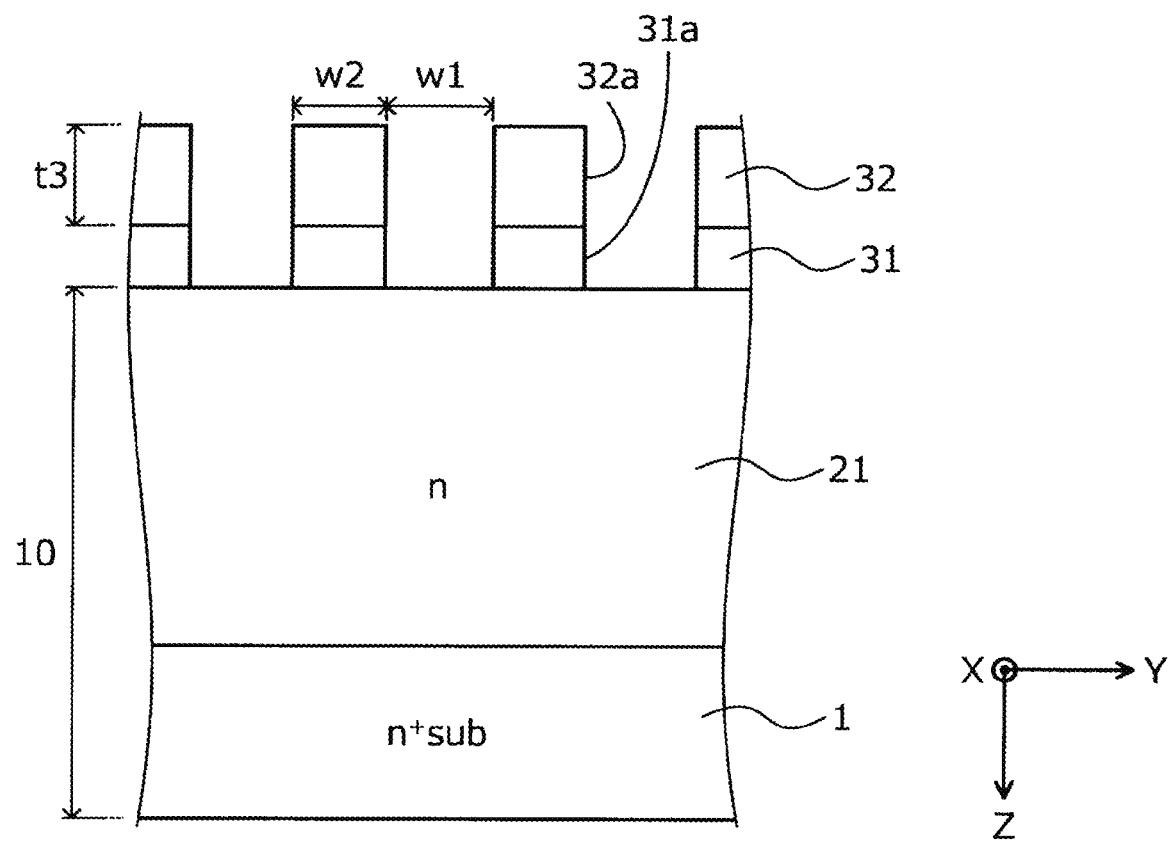
FIG. 4 is a cross-sectional view of the silicon carbide semiconductor device of the embodiment during manufacturing.

Next, as shown in FIG. 4, resist is coated onto the surface of the oxide film 31, and photolithography is used to form a resist film 32 with openings at sections corresponding to the formation regions of the trenches 33. Openings 32a in the resist film 32 are arranged in a stripe-shaped layout (not shown) that extends in a direction (hereinafter, first direction) X parallel to the front surface of the epitaxial substrate 10 as seen from the front surface side of the epitaxial substrate 10.

A width w1 of the openings 32a in the resist film 32 may be around 3 μm, for example, which is substantially the same as the width of the trenches 33 in the widthwise direction (second direction Y). A width w2 of the sections of the resist film 32 remaining between the openings 32a may be around 3 μm, for example, which is substantially the same as the width of the sections interposed between adjacent trenches 33 (a width w4 of mesa regions 21a in the widthwise direction; see FIG. 5). A thickness t3 of the resist film 32 is thick enough that the resist film 32 is not lost during dry etching of the oxide film 31.

Next, with the resist film 32 as a mask, the oxide film 31 is dry etched with a mixed gas of trifluoromethane ($CHF_3$) gas, carbon tetrafluoride ($CF_4$) gas, and argon (Ar) gas, for example, until the surface of the n-type epitaxial layer 21 is exposed. This forms openings in the oxide film 31 in the same pattern as the resist film 32, and forms the openings 31a in the sections of the oxide film 31 corresponding to the formation regions of the trenches 33. The resist film 32 is then removed.

Figure 5:
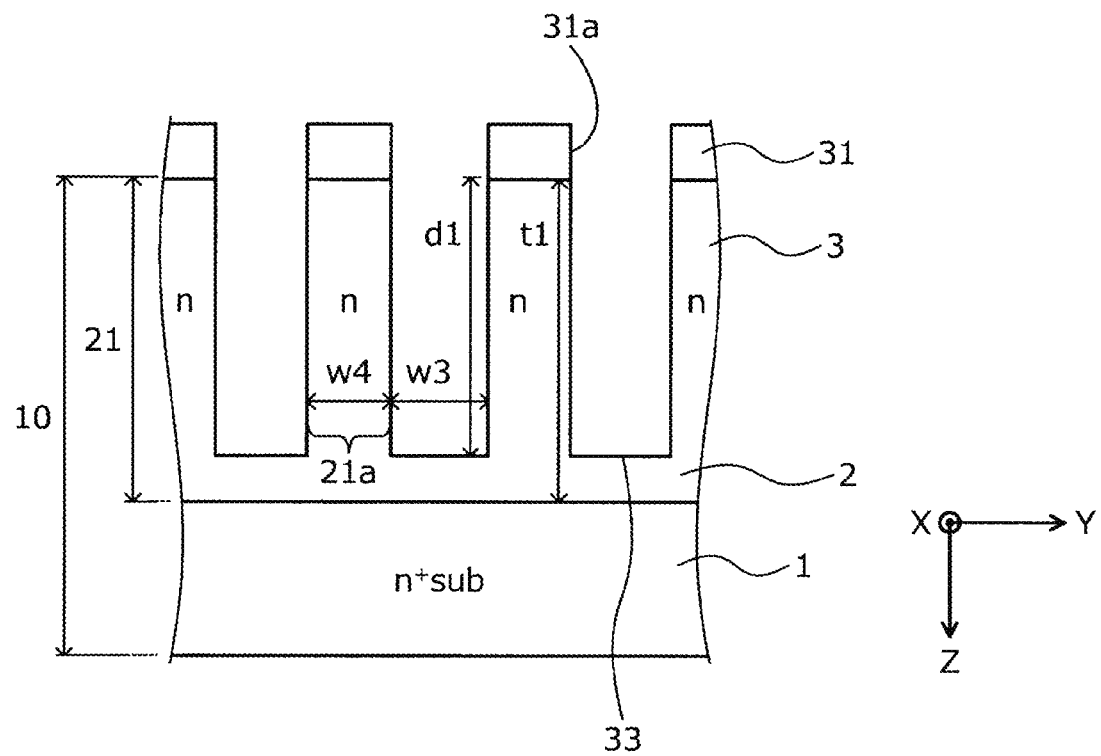
FIG. 5 is a cross-sectional view of the silicon carbide semiconductor device of the embodiment during manufacturing.

Next, as shown in FIG. 5, the n-type epitaxial layer 21 is dry etched with the remaining parts of the oxide film 31 as a mask, thereby forming a plurality of trenches 33 that reach from the front surface of the epitaxial substrate 10 to a prescribed depth dl (step S2). The depth dl of the trenches 33 is shallower than the thickness t1 of the n-type epitaxial layer 21, and may be around 25 μm, for example. The effects of the present invention can be further exhibited by setting the aspect ratio (=the depth dl of the trench 33/the width w3 of the trench 33 in the widthwise direction) of the trenches 33 to 5 or more, for example, and specifically, the aspect ratio may be around 8.3, for example.

In the dry etching of the trenches 33 in step S2, side etching (etching in the horizontal direction) and the generation of sub-trenches are preferably prevented to the greatest extent possible, and a mixed gas of sulfur fluoride ($SF_6$) gas, oxygen ($O_2$) gas, and argon (Ar) gas is preferably used, for example. Sub-trenches are depressions in the bottom surface corners of the trenches 33. The bottom surface corners of the trenches 33 are the boundary between the bottom surface and side walls of the trench 33.

The portions (mesa regions) 21a of the n-type epitaxial layer 21 interposed between the adjacent trenches 33 serve as the n-type regions 3 of the parallel pn structure 5. The portion of the n-type epitaxial layer 21 below the bottom of the trenches 33 towards the n$^+$ starting substrate 1 serves as an n-type buffer layer 2. The section of the n-type epitaxial layer 21 serving as the n-type buffer layer 2 may have a lower impurity concentration than the section of the parallel pn structure 5 serving as the n-type region 3. Next, the remaining parts of the oxide film 31 used as the mask for dry etching of the trenches 33 are removed by hydrofluoric acid (HF) or the like, for example, and then the epitaxial substrate 10 is further cleaned.

Figure 6:
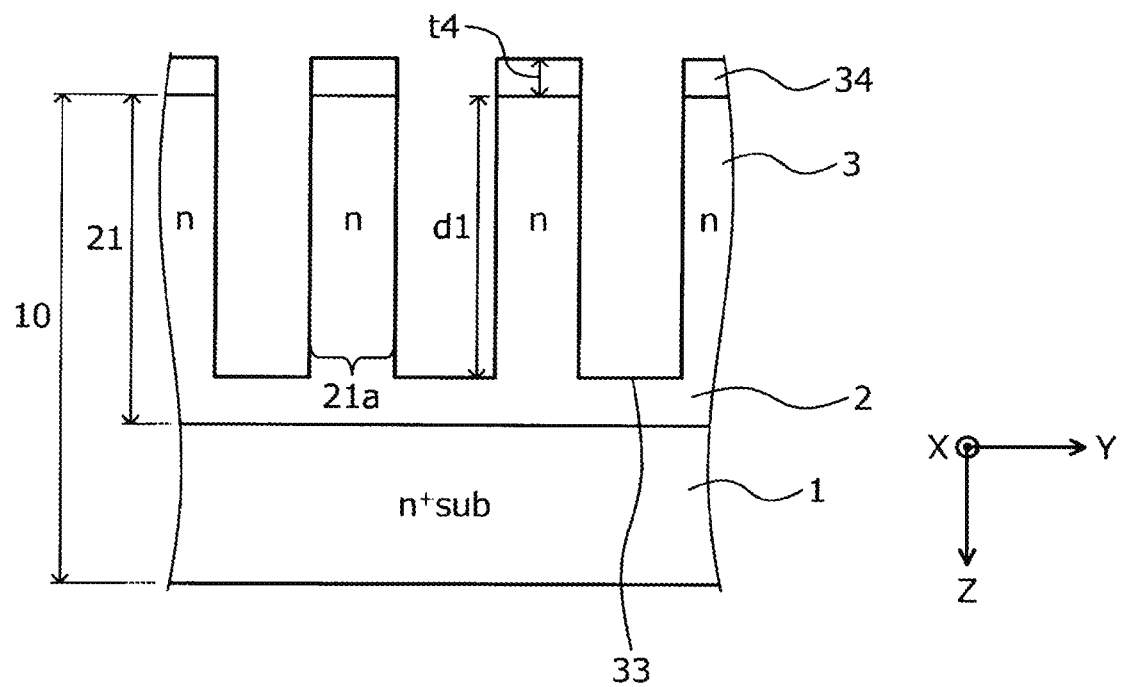
FIG. 6 is a cross-sectional view of the silicon carbide semiconductor device of the embodiment during manufacturing.

Next, as shown in FIG. 6, a mask film, such as a tantalum carbide (TaC) film 34, is formed on the surface of the mesa regions 21a (the sections (flat parts) of the front surface of the epitaxial substrate 10 other than the trenches 33) (step S3). The TaC film 34 is preferably formed by sputtering, for example. The reason of using sputtering is because, if the TaC film 34 is formed by CVD, then it is easy for the TaC film 34 to be deposited on the inner walls (side walls and bottom surface) of the trenches 33. By forming the TaC film 34 via sputtering, it is possible to prevent the product generated by the sputtering (i.e., TaC) from going around from the front surface side of the epitaxial substrate 10 into the inner wall side of the trenches 33 and adhering to the inner walls of the trenches 33.

It is preferable that the thickness of the TaC film 34 be made as thin as possible to prevent the wrapping around of the TaC from the front surface side of the epitaxial substrate 10 to the inner wall side of the trenches 33. Specifically, a thickness t4 of sections of the TaC film 34 on the front surface of the epitaxial substrate 10 (hereinafter, the thickness of the sections on the substrate) may be not less than approximately 20 nm and not more than approximately 40 nm, for example. If the thickness t4 of the sections of the TaC film 34 on the substrate is made around 40 nm, then the thickness of the sections of the TaC film 34 on the side walls of the trenches 33 is around 10 nm (the sections of the TaC film 34 on the side walls of the trench 33 are not shown). Furthermore, some TaC also adheres to the bottom surface of the trenches 33.

In other words, by forming the TaC film 34 via sputtering, it is possible to form the TaC film 34 with differing thicknesses between the sections on the front surface of the epitaxial substrate 10 (the thickness t4 of the sections on the substrate) and the sections on the inner walls of the trenches 33. Specifically, the TaC film 34 may be formed by reactive sputtering using a sputtering target that contains tantalum (Ta) of 99.99% purity at a pressure of 1 Pa in a mixed gas atmosphere to which ethylene ($C_2H_4$) gas has been introduced so as to have a flow rate ratio of around 20% relative to the argon (Ar) gas, for example. During forming of the TaC film 34, the epitaxial substrate 10 may be heated to around 400° C., for example.

Next, the TaC film 34 is etched to remove the sections of the TaC film 34 on the inner walls of the trenches 33 (step S4). If the thickness t4 of the sections of the TaC film 34 on the substrate is set to around 40 nm as described above, then the thickness of the sections of the TaC film 34 on the side walls of the trenches 33 will be around 10 nm, and some of the TaC film 34 will be formed on the bottom surface of the trenches 33. Due to this, etching the TaC film 34 until the thickness t4 of the sections on the substrate is 30 nm makes it possible to remove the sections of the TaC film 34 on the inner walls of the trenches 33 to expose the inner walls of the trenches 33. The etching of the TaC film 34 may use a mixed solution of hydrofluoric acid (HF) and nitric acid ($HNO_3$) or a mixed solution of hydrofluoric acid (HF), sulfuric acid ($H_2SO_4$), and nitric acid ($HNO_3$), for example. The epitaxial substrate 10 is then cleaned with pure water and dried.

Figure 7:
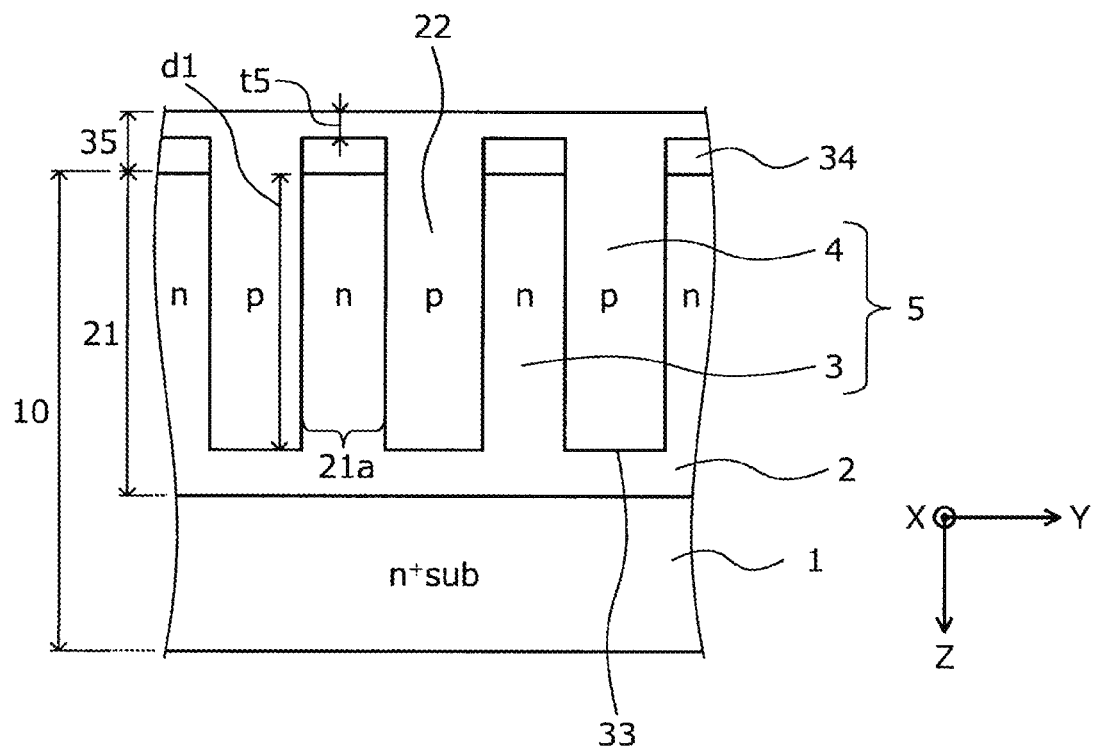
FIG. 7 is a cross-sectional view of the silicon carbide semiconductor device of the embodiment during manufacturing.

Next, as shown in FIG. 7, while the surface of the mesa regions 21a is covered with the TaC film 34, the p-type epitaxial layer 22 made of silicon carbide is epitaxially grown via CVD, for example, and the inside of the trenches 33 is filled with the p-type epitaxial layer 22 (step S5). Specifically, the epitaxial substrate 10, which has finished the processes up to and including step S4, is inserted into an epitaxial growth furnace of an epitaxial growth device (a CVD device, for example). The p-type epitaxial layer 22 may be epitaxially grown with a film forming time of not less than around 2 hours and 20 minutes and not more than around 3 hours at a temperature of around 1650° C. in a gas atmosphere to which around 50 slm of hydrogen ($H_2$) gas has been introduced as the carrier gas, monosilane ($SiH_4$) gas and dimethylmethane ($C_3H_8$) gas have been introduced as the material gases, trimethylaluminum (TMA) has been introduced as the doping gas, and hydrogen chloride (HCl) or the like has been introduced as the etching gas, for example.

The flow rate of each gas used in the process in step S5 may be around 30 sccm (standard cc/min) for the $SiH_4$ gas, around 10 sccm for the $C_3H_8$ gas, not less than around 0.7 slm and not more than 1.7 slm for the HCl gas, and not less than around 0.5 sccm and not more than 6 sccm for the TMA gas. The HCl gas has a function of preventing the occurrence of voids in the p-type epitaxial layer 22. The reason that the flow rate of the HCl gas is set to the aforementioned range is as follows. If the flow rate of the HCl gas is less than 0.7 slm, it becomes easier for voids to be generated in the p-type epitaxial layer 22. If the flow rate of the HCl gas is more than 1.7 slm, then the etching effects of the HCl gas will become too great, and the filling speed of the p-type epitaxial layer 22 into the trenches 33 will be slow. The flow rate of the TMA gas is adjusted such that the p-type epitaxial layer 22 has a prescribed doping concentration.

During the process in step S5, the surface of the mesa regions 21a is covered by the TaC film 34. The TaC film 34 has heat resistance against the high temperature in the epitaxial growth furnace (epitaxial growth temperature: around 1700° C. or more, for example) as required during epitaxial growth of the silicon carbide layer, and almost none of the silicon carbide layer adheres to the TaC film 34. Due to this, the p-type epitaxial layer 22 made of silicon carbide is not susceptible to being deposited on the mesa regions 21a covered by the TaC film 34. Accordingly, the column-shaped sections (corresponding to reference character 122a in the conventional technology in FIG. 10) that inhibit the filling of the inside of the trenches 33 with the p-type epitaxial layer 22 are not formed on the sections of the p-type epitaxial layer 22 on the mesa regions 21a. Furthermore, the inner walls of the trenches 33 are not covered by the TaC film 34, and thus the p-type epitaxial layer 22 is deposited on the inner walls of the trenches 33 at a speed that is based on prescribed epitaxial growth conditions, and the inside of the trenches 33 is filled with the p-type epitaxial layer 22. This makes it possible to efficiently fill the inside of the trenches 33 with the p-type epitaxial layer 22 and to increase the speed at which the inside of the trenches 33 is filled with the p-type epitaxial layer 22.

The sections of the p-type epitaxial layer 22 filled inside of the trenches 33 serves as the p-type regions 4 of the parallel pn structure 5. In other words, the parallel pn structure 5 is formed by the sections (the n-type regions 3) of the n-type epitaxial layer 21 interposed between the trenches 33 and the sections (the p-type regions 4) of the p-type epitaxial layer 22 filled inside the trenches 33 such that the n-type regions 3 and p-type regions 4 are alternately and repeatedly disposed in the direction (horizontal direction) parallel to the front surface of the epitaxial substrate 10 as well as in the direction (hereinafter, second direction) Y orthogonal to the first direction X. The n-type regions 3 and p-type regions 4 of the parallel pn structure 5 are disposed in a stripe-shaped layout (not shown) that extends in the first direction X as seen from the front surface side of the epitaxial substrate 10.

Figure 8:
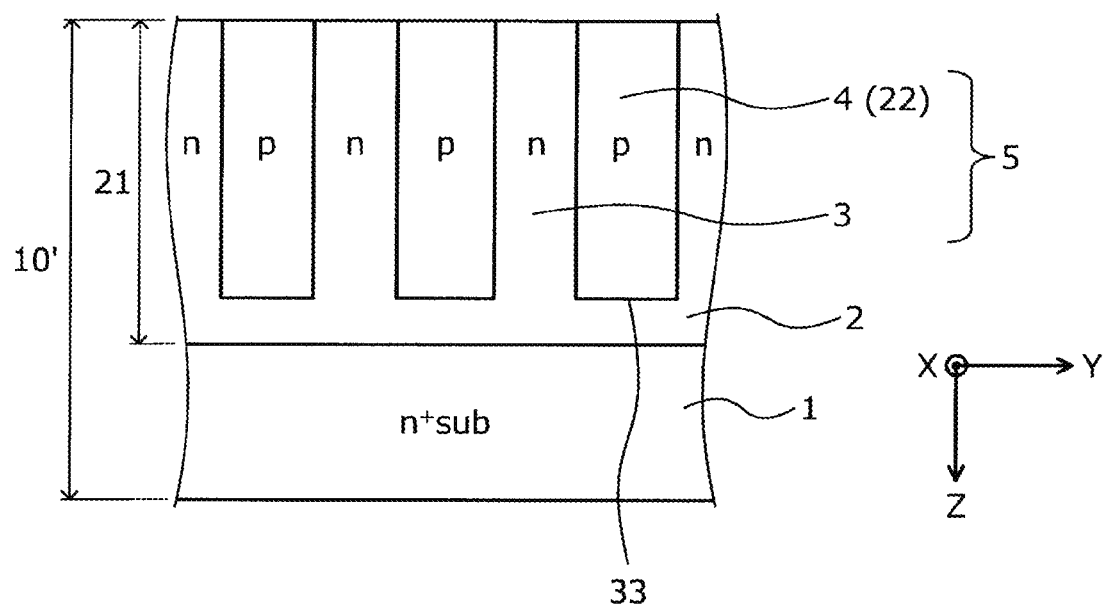
FIG. 8 is a cross-sectional view of the silicon carbide semiconductor device of the embodiment during manufacturing.

Section 35 of the p-type epitaxial layer 22 protruding above the surface of the parallel pn structure 5 are unnecessary sections that are not used for any part of the super junction MOSFET. The sections 35 of the p-type epitaxial layer 22 protruding above the surface of the parallel pn structure 5 protrude upward from the trench 33 opening side of the p-type epitaxial layer 22 (in other words, from the trenches 33 on the front surface of the epitaxial substrate 10). Due to this, after the epitaxial substrate 10 is removed from the epitaxial growth furnace, the sections 35 of the p-type epitaxial layer 22 protruding above the surface of the parallel pn structure 5 and the TaC film 34 on the surface of the mesa regions 21a are ground until the n-type regions 3 and p-type regions 4 of the parallel pn structure 5 are exposed as shown in FIG. 8. In addition, chemical mechanical polishing (CMP) is used to planarize the surface of the parallel pn structure 5 (i.e., the front surface of the epitaxial substrate 10) such that the forming of device structures thereafter is not harmed (step S6).

Figure 10:
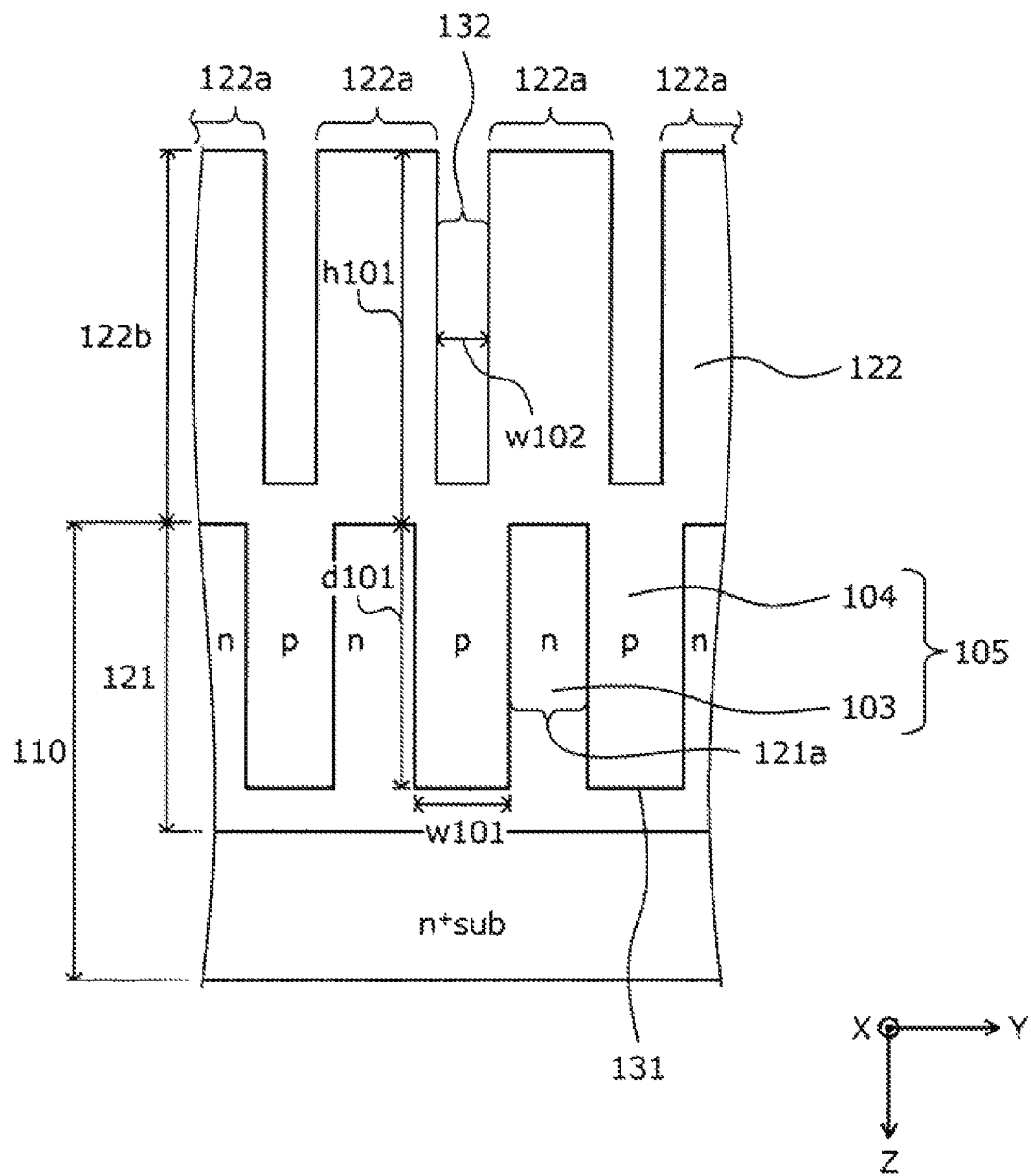
FIG. 10 is a cross-sectional view of a conventional silicon carbide semiconductor device during manufacturing.

The removed amount of the p-type epitaxial layer 22 by the grinding and polishing in step S6 (grinding/polishing amount) is significantly less than the conventional technology (see FIG. 10). The reason for this is because almost none of the p-type epitaxial layer 22 is deposited on the TaC film 34 covering the surface of the mesa regions 21a, as described above. The steps up to this point provide a super junction structure epitaxial substrate (planarized epitaxial substrate) 10' that has the parallel pn structure 5, which has been planarized to a state where it is possible to form device structures on the surface. Next, this epitaxial substrate 10' is cleaned. Then, prescribed device structures for a MOSFET is formed on the epitaxial substrate 10' by a common method (step S7). Thereafter, the epitaxial substrate 10' is diced (cut) into a plurality of chip shapes to complete the super junction MOSFET.

Figure 9:
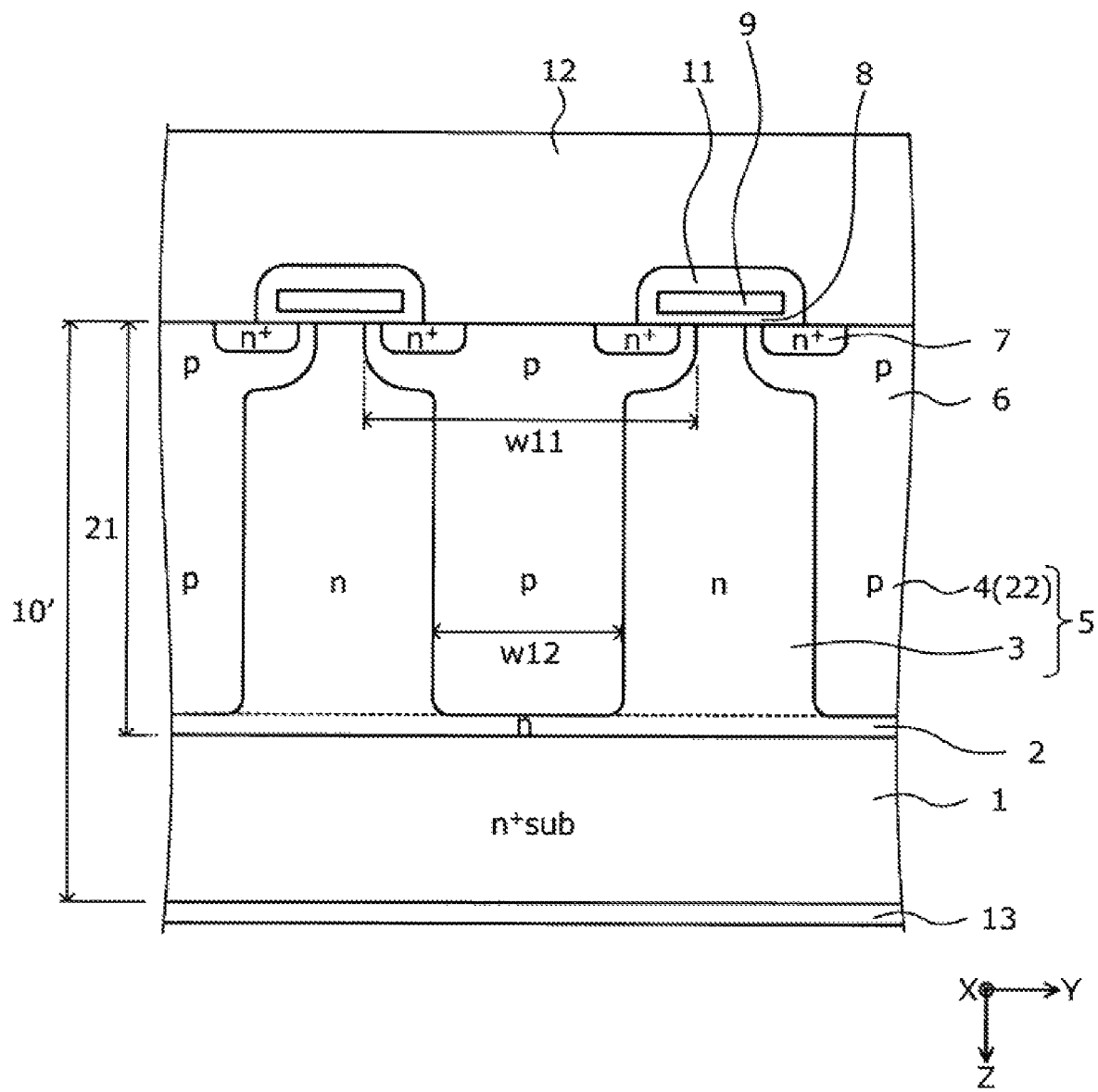
FIG. 9 is a cross-sectional view of one example of a silicon carbide semiconductor device manufactured by the method of manufacturing a silicon carbide semiconductor device of the embodiment.

An example of the structure of the super junction MOSFET fabricated in this manner will be described. FIG. 9 is a cross-sectional view of one example of a silicon carbide semiconductor device manufactured by the method of manufacturing the silicon carbide semiconductor device of the embodiment. The silicon carbide semiconductor device of the embodiment shown in FIG. 9 is a super junction MOSFET in which the drift layer is configured to be a parallel pn structure 5 in which n-type regions 3 and p-type regions 4 with heightened impurity concentrations are alternately and repeatedly disposed in a direction (horizontal direction) parallel to the substrate front surface of the epitaxial substrate (semiconductor chip) 10'.

The epitaxial substrate 10' has the parallel pn structure 5 layered via the n-type buffer layer 2 on the front surface of the n⁺ starting substrate 1, which serves as the n⁺ drain layer. The n-type buffer layer 2 may have a lower impurity concentration than the n-type regions 3 of the parallel pn structure 5. Furthermore, the n-type buffer layer 2 need not be provided. A MOS gate structure having an ordinary planar gate structure, which is made of a p-type base region 6, an n⁺ source region 7, a gate insulating film 8, and a gate electrode 9, for example, is provided on the front surface (parallel pn structure 5 side surface) side of the epitaxial substrate 10'.

The p-type base region 6 is selectively provided in the front surface layer of the epitaxial substrate 10'. The p-type base region 6 faces the p-type region 4 of the parallel pn structure 5 in the depth direction Z and contacts the p-type region 4. A width w11 of the p-type base region 6 is greater than a width w12 of the p-type region 4, and the p-type base region 6 is provided from the p-type region 4 that the p-type base region faces in the depth direction Z to the n-type regions 3 adjacent to the p-type region 4. The depth direction Z goes from the front surface to the rear surface of the epitaxial substrate 10'. The n⁺ source region 7 is selectively provided inside the p-type base region 6. The inside of the p-type base region 6 may be provided with a p⁺ contact region (not shown).

The gate insulating film 8 is provided on the surface of a section of the p-type base region 6 interposed between the n⁺ source region 7 and n-type region 3 of the parallel pn structure 5 and goes across the adjacent n⁺ source regions 7 having the n-type region 3 of the parallel pn structure 5 interposed therebetween. The gate electrode 9 is provided on the gate insulating film 8. A source electrode 12 contacts the n⁺ source region 7 and p-type base region 6 (if a p⁺ contact region is provided, then the n⁺ source region 7 and p⁺ contact region are contacted) and is electrically insulated from the gate electrode 9 by an interlayer insulating film 11. A drain electrode 13 is provided on the rear surface of the epitaxial substrate 10' (rear surface of the n⁺ starting substrate 1).

As described above, according to the embodiment, trenches are formed in the n-type epitaxial layer and sections that serve as the n-type regions of the parallel pn structure are left, and thereafter, while the surfaces between the trenches (mesa regions) are covered by a TaC film, the inside of the trenches is filled with the p-type epitaxial layer, which serves as the p-type regions of the parallel pn structure. The p-type epitaxial layer is not susceptible to being epitaxially grown on the TaC film, and thus excess column-shaped p-type epitaxial layers are not formed on the surface of the mesa regions. Due to this, it is possible to efficiently fill the inside of the trenches with the p-type epitaxial layer. Due to this, even if the p-type epitaxial layer is epitaxially grown with the same epitaxial growth conditions as the conventional technology, it is possible to make the filling speed of the p-type epitaxial layer higher than the conventional technology.

Furthermore, according to the embodiment, the excess columnar-shaped p-type epitaxial layers are not grown on the surface of the mesa regions, which makes it possible to shorten the processing time of the grinding and polishing step that exposes the n-type regions and p-type regions of the parallel pn structure and planarizes the front surface of the epitaxial substrate. By increasing the filling speed of the p-type epitaxial layer and shortening the processing times of the grinding and polishing in this manner, it is possible to improve productivity and to shorten lead time. Furthermore, according to the embodiment, the excess column-shaped p-type epitaxial layers do not grow on the surface of the mesa regions, which makes it possible to reduce the amount of etching gas such as HCl that is introduced to the epitaxial growth furnace. This makes it possible to prevent the degradation (corrosion of the metal parts, etc.) of the constituent components of the epitaxial growth device caused by the etching gas.

The present invention as described above is not limited to the aforementioned embodiments, and various modifications can be made without departing from the spirit of the present invention. The present invention can also be applied to a trench gate MOSFET, for example. In such case, in the forming of the device structures in step S7, for example, the p-type epitaxial layer serving as the p-type base regions would be formed on the parallel pn structure, and gate trenches would be formed going through the p-type base regions in the depth direction and reaching the n-type regions of the parallel pn structure. Furthermore, in the embodiment, the dimensions of the parts, the impurity concentrations, the epitaxial growth conditions of the p-type epitaxial layer, etc., are set in accordance with the required specifications or the like.

In addition, in the embodiment described above, an example is described in which the mask film that covers the surface between the trenches (mesa regions) while the inside of the trenches is being filled with the silicon carbide epitaxial layer is configured to be a tantalum carbide (TaC) film, but the present invention is not limited to this, and a mask film formed with a material that exhibits the same effects as a tantalum carbide film may be used instead of the tantalum carbide film. In other words, the mask film covering the surface of the mesa regions may be formed with a material that has a film quality capable of being used as a mask film, that can have the sections thereof formed on the trench inner walls and removable via dissolving with chemicals or a plasma treatment, and that is not susceptible to having the silicon carbide epitaxial layer deposited on the surface of the mask film.

If using a material that deposits almost none of the silicon carbide epitaxial layer on the surface of the mask film (a material that repels the silicon carbide molecules at the surface of the mask film to too great an extent) is used as the material of the mask film covering the surface of the mesa regions during filling the inside of the trenches with the silicon carbide epitaxial layer, then there is a risk that the silicon carbide molecules not deposited on the surface of the mask film (the repelled silicon carbide molecules) could produce particles (fine dust). Due to this, it is preferable that the mask film covering the surface be formed of a material that can keep the thickness of the sections of the mask film deposited on the surface thin and with which the silicon carbide molecules adhere to the surface of the mask film to an extent capable of preventing particles from being produced.

Specifically, the same effects as a tantalum carbide film can be exhibited even if, instead of the tantalum carbide film, a carbon (C) film is used as the mask film covering the surface of the mesa regions and is formable by sputtering or CVD and removable by an oxygen plasma treatment, for example. When the surface of the mesas is covered by a carbon film in this manner, there is a risk that the silicon carbide epitaxial layer that has grown on the carbon film could peel off and produce particles during the epitaxial growth of the silicon carbide epitaxial layer for filling the inside of the trenches, and thus it is preferable that countermeasures be taken to prevent the production of particles.

Furthermore, the same effects as a tantalum carbide film can be exhibited even if a film made of a carbide of a differing refractory metal is used as the mask film covering the surface of the mesa regions instead of the tantalum carbide film. Such a carbide of a refractory metal is a compound of carbon (C) and a metal that has the heat resistance against the high temperature (epitaxial growth temperature) inside the epitaxial growth furnace necessary during epitaxial growth of the silicon carbide layer. The materials for such a carbide of a refractory metal include tungsten carbide (WC) and molybdenum carbide ($Mo_2C$), having a hexagonal crystal structure, titanium carbide (TiC) and niobium carbide (NbC), having a face-centered cubic lattice structure (cubic crystal structure), and vanadium carbide (VC) and zirconium carbide (ZrC), having a simple cubic lattice structure (cubic crystal structure), for example. Titanium carbide and niobium carbide having the same crystal structure as the tantalum carbide film are more preferably suited as a substitute for the tantalum carbide film. These refractory metal carbide films should be formed with conditions that can prevent the growth of the excess silicon carbide epitaxial layers on the surface of the mesa regions, and the forming conditions, etching conditions, etc., therefor are determined in accordance with the required specifications or the like.

In the embodiment described above, an example is described in which trenches in which p-type regions of the parallel pn structure are filled are formed in the epitaxial substrate (semiconductor substrate) where the n-type epitaxial layer has been layered on the n⁺ starting substrate, but the present invention is not limited to this, and trenches in which p-type regions of the parallel pn structure are filled may be formed in an n-type bulk substrate (semiconductor substrate). Furthermore, an example is described in which two or more trenches in which the p-type regions of the parallel pn structure are filled are formed, but only one trench in which the p-type region of the parallel pn structure is filled may be formed to form a parallel pn structure that includes two n-type regions and a single p-type region interposed between the two n-type regions.

Furthermore, in the embodiment described above, an example of the parallel pn structure is described in which the n-type regions and p-type regions are disposed in a stripe-shaped layout as seen from the front surface side of the epitaxial substrate, but the n-type regions of the parallel pn structure may be disposed in a matrix shape and the p-type regions may be disposed in a lattice shape surrounding the n-type regions as seen from the front surface side of the epitaxial substrate. In addition, the present invention is not limited to a case where a super junction semiconductor device is fabricated, and can be applied to a silicon carbide semiconductor device having a configuration in which n-type regions and p-type regions are disposed alternately and repeatedly in the horizontal direction by the trench-filling epitaxial scheme.

The present invention is the same even if the conductivity types (n-type, p-type) are inverted. In other words, the present invention can also be applied to a case in which a p-type epitaxial layer is deposited on the n⁺ starting substrate and the trenches formed in the p-type epitaxial layer are filled with an n-type epitaxial layer. In such case, the TaC film would be formed on the surface of the sections (mesa regions) of the p-type epitaxial layer interposed between adjacent trenches. Moreover, a p-channel MOSFET may also be fabricated by using a super junction structure epitaxial substrate having a parallel pn structure instead of fabricating an n-channel MOSFET.

Industrial Applicability

As described above, the method of manufacturing the silicon carbide semiconductor device and the method of manufacturing the silicon carbide substrate of the present invention are useful for the fabrication (manufacturing) of an epitaxial substrate having a configuration in which n-type regions and p-type regions are disposed alternately and repeatedly in the horizontal direction via a trench-filling epitaxial scheme, are useful for a silicon carbide semiconductor device fabricated using this epitaxial substrate, and are particularly suited for the fabrication of a super junction semiconductor device.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A method for manufacturing a silicon carbide semiconductor device having a parallel pn structure in which a first conductivity type region and a second conductivity type region are alternately disposed side-by-side in a horizontal direction, the method comprising:
    a first step of forming a vertical trench in a semiconductor substrate of the first conductivity type made of silicon carbide, the trench reaching a prescribed depth from a front surface of the semiconductor substrate, the first step including forming a patterned oxide film on the semiconductor substrate, etching the semiconductor substrate using the patterned oxide film as a mask to form the trench, and thereafter, removing the patterned oxide film;
    a second step of forming a mask film covering portions of the front surface of the semiconductor substrate where the trench is not formed, the mask film being absent within the trench, the second step including:
        forming, by sputtering, a layer made of a carbide of a refractory metal over an entire surface of the semiconductor substrate having the trench formed therein so that the layer made of the carbide of the refractory metal on side walls of the trench and on a bottom of the trench is thinner than the layer made of the carbide of the refractory metal on said portions of the front surface of the semiconductor substrate where the trench is not formed; and
        exposing the layer made of the carbide of the refractory metal to an etchant so as to remove the layer made of the carbide of the refractory metal entirely from the side walls and the bottom of the trench and leaving said layer made of the carbide of the refractory metal on said portions of the front surface of the semiconductor substrate where the trench is not formed, thereby forming the mask film;
    a third step of epitaxially growing a second conductivity type silicon carbide layer while the front surface of the semiconductor substrate is covered by the mask film, so as to fill an inside of the trench with the epitaxially grown second conductivity type silicon carbide layer, thereby creating the parallel pn structure and to form the epitaxially grown second conductivity type silicon carbide layer on a front surface of the mask film; and
    a fourth step of etching, from above, a portion of the epitaxially grown second conductivity type silicon carbide layer that is formed on the front surface of the mask film and successively etching the mask film thereunder so as to expose the front surface of the semiconductor substrate of the first conductivity type, thereby creating an exposed flat top surface of the parallel pn structure,
    wherein, in the second step, the mask film is formed of the carbide of the refractory metal that can withstand an epitaxial growth temperature during the third step of epitaxially growing the second conductivity type silicon carbide layer and that causes a growth rate of the second conductivity type silicon carbide layer on the mask film in the third step to be slower than a growth rate of the second conductivity type silicon carbide inside the trench in the third step.

2. The method according to claim 1, wherein, in the second step, the mask film is formed at a thickness not less than 20 nm and not more than 40 nm.

3. The method according to claim 1, wherein, in the second step, the mask film is formed via sputtering.

4. The method according to claim 1, further comprising, after the fourth step, a fifth step of making a device structure on or over the exposed flat top surface of the parallel pn structure.

5. The method according to claim 1, wherein, in the first step, the trench is formed with an aspect ratio of 5 or greater, the aspect ratio being defined as a ratio of a depth of the trench to a width of the trench.

6. The method according to claim 1, further comprising, prior to the first step, a step of making the semiconductor substrate by layering a first conductivity type epitaxial layer made of silicon carbide on a starting substrate made of silicon carbide, thereby forming the semiconductor substrate constituted of the starting substrate and the first conductivity type epitaxial layer thereon, and wherein, in the first step, the trench is formed in the first conductivity type epitaxial layer.

7. The method according to claim 1, wherein, in the second step, a tantalum carbide film is formed as the mask film.

8. The method according to claim 1, wherein in the first step, the trench is formed in a plurality so that the parallel pn structure includes the first conductivity type region in a plurality and the second conductivity type region in a plurality that are alternately and repeatedly disposed side-by-side in the horizontal direction.

9. The method according to claim 1, further comprising, after the third step, a fourth step of grinding and polishing a top layer of the semiconductor substrate that includes the epitaxially grown second conductivity type silicon carbide on the mask film and the mask film thereunder so as to expose the front surface of the semiconductor substrate of the first conductivity type, thereby creating an exposed flat top surface of the parallel pn structure.

10. The method according to claim 9, further comprising, after the fourth step, a fifth step of making a device structure on or over the exposed flat top surface of the parallel pn structure.

* * * * *